United States Patent
Joist et al.

(10) Patent No.: US 6,915,562 B2
(45) Date of Patent: Jul. 12, 2005

(54) DEVICE FOR THE INSERTION AND EXTRACTION OF A PLUG-IN MODULE

(75) Inventors: Michael Joist, Gaggenau (DE); Volker Haag, Bad Wildbad (DE); Paul Mazura, Karlsbad (DE); Klaus-Michael Thalau, Malsch (DE); Hans-Jorg Weiler, Ettlingen (DE)

(73) Assignee: Schroff GmbH, Straubenhardt (DE)

( * ) Notice: Subject to any disclaimer, the term of this patent is extended or adjusted under 35 U.S.C. 154(b) by 239 days.

(21) Appl. No.: 10/359,022

(22) Filed: Feb. 5, 2003

(65) Prior Publication Data

US 2003/0172523 A1 Sep. 18, 2003

(30) Foreign Application Priority Data

Feb. 7, 2002 (EP) ............................................. 02002749

(51) Int. Cl.⁷ ................................................. B23P 19/00
(52) U.S. Cl. .............................. 29/758; 29/729; 29/759; 29/764; 361/754; 361/798; 361/759; 361/801; 439/157; 439/327
(58) Field of Search .......................... 29/758, 764, 729, 29/759, 270, 267, 260; 361/755, 754, 798, 759, 801; 439/152, 153 T, 325 T, 64

(56) References Cited

U.S. PATENT DOCUMENTS

| | | | | |
|---|---|---|---|---|
| 4,083,616 A | * | 4/1978 | McNiece et al. | ............ 439/157 |
| 4,996,631 A | * | 2/1991 | Freehauf | ...................... 361/798 |
| 5,309,325 A | * | 5/1994 | Dreher et al. | ................ 361/754 |
| 5,504,656 A | * | 4/1996 | Joist | ............................ 361/754 |
| 5,506,758 A | * | 4/1996 | Cromwell | .................... 361/798 |
| 5,675,475 A | * | 10/1997 | Mazura et al. | .............. 361/798 |
| 5,722,787 A | * | 3/1998 | Mazura et al. | ............. 174/68.2 |
| 6,148,506 A | * | 11/2000 | Vermette | ...................... 29/758 |
| 6,246,585 B1 | * | 6/2001 | Gunther et al. | ............. 439/377 |
| 6,447,082 B1 | | 9/2002 | Haag et al. | .................. 312/263 |
| 2003/0172523 A1 | * | 9/2003 | Joist et al. | ..................... 29/758 |

FOREIGN PATENT DOCUMENTS

| | | | | |
|---|---|---|---|---|
| DE | 19817089 | | 8/1999 | ............ H05K/7/14 |
| GB | 2292259 | * | 2/1996 | |
| JP | 2003-152360 | * | 5/2003 | |

* cited by examiner

*Primary Examiner*—Carl J. Arbes
*Assistant Examiner*—Minh Trinh
(74) *Attorney, Agent, or Firm*—Schwegman, Lundberg, Woessner & Kluth, P.A.

(57) ABSTRACT

A device for the insertion and extraction of a plug-in module into a module frame which has at least one front module bar, contains a swivel-mounted lever which is located in the front area of the plug-in module and whose short lever arm has at least one lever cam and a push-off nose and a pressure piece which is fastened to the module bar. The pressure piece absorbs the forces transferred from the lever, whereby the pressure piece has at least one recess, in which the lever cam of the lever reaches into during the insertion of the plug-in module. Furthermore the pressure piece has at least one push-off shoulder against which the push-off nose of the lever pushes off during the extraction of the plug-in module.

11 Claims, 9 Drawing Sheets

10°

0°

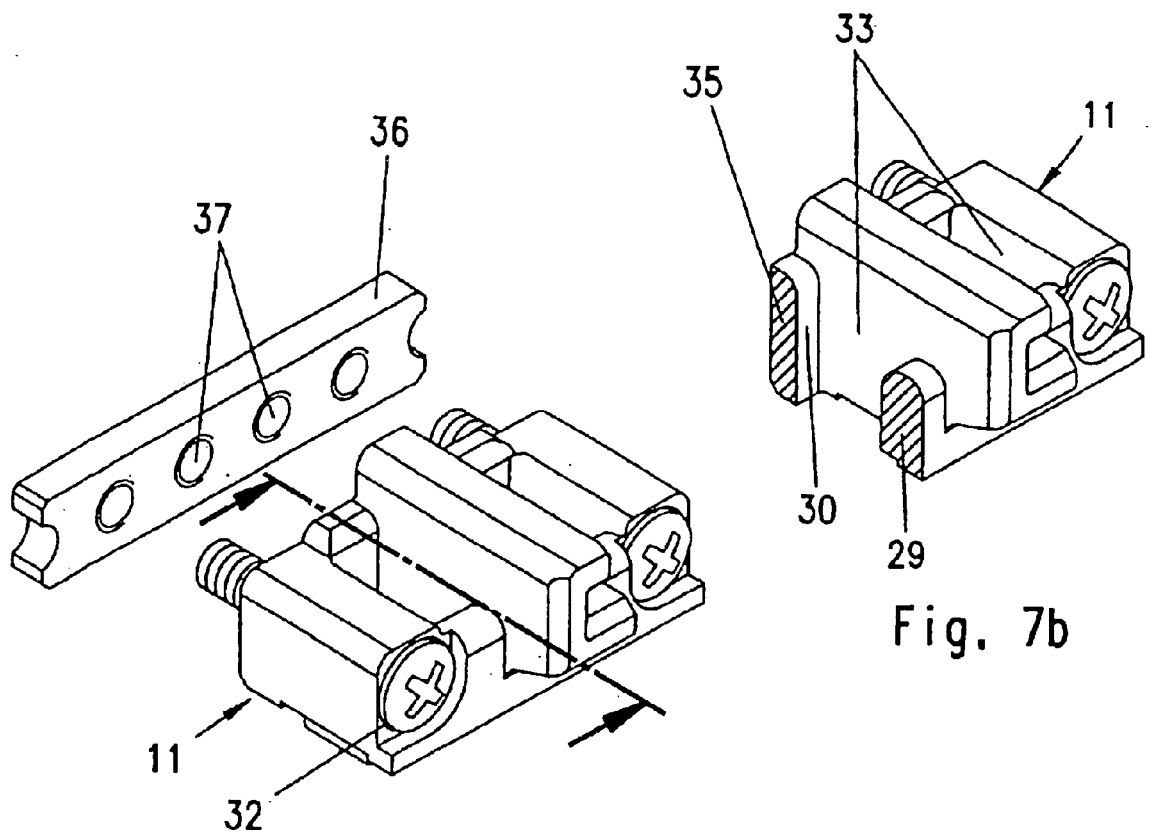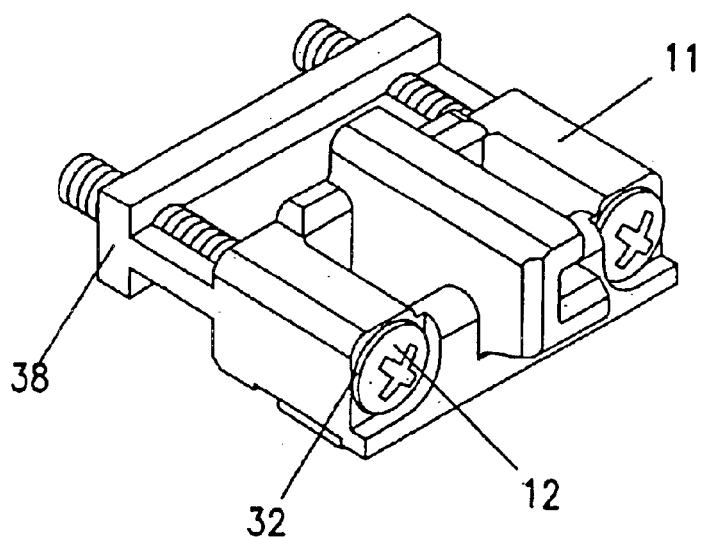

DEVICE FOR THE INSERTION AND EXTRACTION OF A PLUG-IN MODULE

RELATED APPLICATION

This application claims priority under 3 U.S.C. 119 from European Application No. EP 02 002 749.6, filed Feb. 7, 2002, which application is incorporated by reference.

FIELD OF THE INVENTION

The present invention concerns a device for the insertion and extraction of a plug-in module into and from a module frame. More particularly, the invention can be used with plug-in modules that can be inserted in slots of a module frame designed for electronic and electrical equipment.

BACKGROUND

Module frames for the reception of plug-in electronic modules are known in the industrial electronic field. One version of such a module frame includes two side walls and four parallel module bars, which border with their two-sided front faces on the two side walls. A metal cover and a metal bottom as well as a rear panel can supplement the module frame to a chassis, from whose open front side the plug-in modules are slid into on inserted guides. The module bars can also be integrated parts of the metal cover, the metal bottom respectively; such a module frame with integrated module bars is, for example, described in the DE 198 17 089 C1.

The plug-in modules are inserted into the module frame on guides from the front in such a way, that the partial front panels of the plug-in modules are adjacent to each other. Each plug-in module is, with the help of multipolar plug connectors, connected on the rear panel of the module frame with a rear wiring board, the so-called back plane. Due to the ever-increasing packing density on the individual plug-in modules and the progressing miniaturization of electronic components, plug connectors with always increasing numbers of poles. The individual contacts are hereby arranged in several rows next to each other. Great forces, which increase proportionally to the number of the poles of the plug connector, are necessary for the insertion and extraction of the plug connectors from the contact strip. Without suitable help, devices such as the plug-in modules cannot be loosened from the module frames, nor is it possible to establish a reliable plug connection between the plug-in module and the back plane.

Lever systems with operation grips in different versions are known as plug-in and pull aides. The plug-in and pull aides are located in the upper and/or lower front area of the plug-in modules.

German Patent DE 44 28 529 C1 reveals a device for the extraction of plug-in modules from a module frame with a module bar. The plug-in module has an angle lever as well as a holding block for a front panel and a circuit board. The angle lever, which is rotatable around a swiveling axis in the holding block, includes a long lever arm that is formed as a grip and a short lever arm that has two push-off shoulders that have different distances to the swiveling axis. The module bar has a small strip attached to the front which extends the module bar forward so that an overhang, the so called roof, is created. During the extraction of the plug-in modules from the module frame the two push-off shoulders push off in succession from the attached strip.

The currently known plug-in and pull aides have several disadvantages.

The dimensions of the front overhang (roof) of the module bar are determined by the standard. The roof is formed as a narrow crosspiece with rectangle sharp edged recesses. The front contact surface is only a few millimeters high. The push-off shoulders of the lever can therefore only grip at a small contact surface, so that a very high contact pressure is generated during the transfer of the lever forces to the module bar.

The module bar and its overhanging roof are usually produced from metal. To avoid unwanted metal abrasion the angle levers and the push-off shoulders are often produced from plastic. When the push-off shoulders glide under high contact pressure over the sharp edges of the module bars, the additional problem is generated that the plastic adapts to the sharp metal edge due to flexible deformation. This kind of unwanted shaping additionally increases the existing frictional forces.

The lever forces appearing during the insertion and the extraction have a component in the direction of insertion or extraction and a component vertical to this direction. The vertical component of the lever force has an effect on the small edge of the roof of the module bar parallel to the front side of the module bar. If very high lever forces are transferred, the module bar bends, so that the lever slips off the module bar and finally does not engage any more. The slipping of the lever is further aided by the very small contact surface of the overhanging roof, which offers the lever only a small abutment.

For module bars without a roof overhanging to the front, the push-off shoulders can only grip directly on the front side of the module bar during the extraction of the plug-in module. But the front side of the module bar is interrupted by the common T-groove. The remaining contact surfaces on the front side, from which the push-off shoulders push off, are barely larger than the contact surfaces of the overhanging roof. Very high contact pressures are generated by the gripping lever as well.

A levering of the plug-in modules into the module frame is currently only possible at module bars with roof, since the push-off shoulders grip into the recesses of the roof strip of the module bar and push off from the inner surface of these recesses that are facing away from the module bar. Common module bars, meaning such without roof, have no abutment for the levering.

SUMMARY

One embodiment of the present invention provides a device for the insertion and extraction of a plug-in module that also enables the transfer of very high insertion and extraction forces, whereby damages to the module frame or to the plug-in module can be avoided.

In one embodiment, the present invention includes a pressure piece, which is fastened to the module bar and absorbs the forces transferred from the lever. The pressure piece has at least one recess and at least one push-off shoulder.

During the insertion of the plug-in module the lever cam of the lever reaches into the recess of the pressure piece. The rotation of the lever has the effect that the lever cam glides into the recess along the push-off shoulder and at the same time the point of rotation of the lever at the plug-in module and therefore the plug-in module is pushed into the module frame in the direction of the plug-in. By design of a deep recess at the pressure piece and a respective design of the lever cam it is possible to realize a wide rotation angle of the lever and therefore a long pull-in path of the plug-in module.

The working surface at the push-off shoulder of the pressure piece offers the lever cam a larger area than the overhanging roof of the module bar. The contact pressure of the lever cam is therefore lower. The transfer of very large forces as well by the lever on the module bar is therefore possible without the danger of damages.

In one embodiment, the pressure piece can also be attached to module bars without overhanging roof. If module bars without overhanging roof are equipped, or equipped at a later time, with pressure pieces according to one embodiment of the invention, plug-in modules with levers can also be used in module frames with common module bars without roof. To that respect, the suggested pressure piece has the function of an adapter which makes it possible to equip module frames with module bars without roof at a later point in time for the use with levers. Naturally, the pressure piece can also be fastened to a module bar that is integrated in a metal top or bottom of a module frame.

During the extraction of the plug-in module the push-off nose of the lever pushes off against the push-off shoulder of the pressure piece. Such a push-off shoulder does not exist in the module bar whose design is determined by the standard. The pressure piece on the other hand is not defined by any standard since it is a separate, additional part. The therefore free design of the pressure piece especially allows a design of the push-off shoulder as a large and smooth surface. Therefore, the push-off shoulder has a larger contact surface than the module bar, by which the contact pressure of the push-off nose of the lever is reduced and substantially higher forces, generated by the lever, can be transferred. Therefore, plug-in modules with multipolar plug connectors as well can be easily, reliably and comfortably removed from the module frame, at long service lives.

In one embodiment, the pressure piece has an additional contact surface against which the lever cam presses during the extraction of the plug-in module. The push-off procedure during the extraction of the plug-in module is therefore divided between the lever cam and the push-off nose of the lever. It is especially advantageous if the lever cam is aligned not parallel but in an acute angle to the push-off nose. During the extraction of the plug-in module the lever cam is first of all engaged with the pressure piece, while the push-off nose presses against the pressure piece at a later point in time. The pulling path generated by the lever can nearly be doubled by the successive engagement of lever cam and push-off nose.

In one embodiment, the push-off shoulder and/or the push-off surface of the pressure piece are aligned parallel to the front side of the module bar. This arrangement of the push-off shoulder and the push-off surface gives the lever the best engagement possibilities and a high efficiency.

In one embodiment of the device according to invention, the pressure piece is removable and attached to the front side of the module bar. This offers the advantage that the pressure piece is exchangeable in case of damage and on the other hand the pressure piece can be mounted exactly at the position in which the plug-in module is to be inserted, by which the flexibility is increased.

In one embodiment, the pressure piece has at least one drill hole for the reception of a mounting screw. The mounting screw extends through the drill hole into the T-groove of the module bar. A tapped hole strip with thread holes is slid into the T-groove of the module bar. The mounting screw reaches into the corresponding thread holes of the tapped hole strip and by this holds the pressure piece to the module bar.

In one embodiment, in cross-section the pressure piece can have a T-shaped base. The T-shaped base serves for the insertion in the corresponding T-groove of the module bar. The T-shaped base increases the hold of the pressure piece at the module bar, which prevents a deformation or bending of the pressure piece at great lever forces. If the T-groove of the module bar is filled completely with pressure pieces with T-shaped bases, they hold each other in the required position.

In one embodiment of the invention a holding part, with has a gliding guide, is fastened to the plug-in module. At the same time a gliding-surface bearing is formed at the pressure piece. The gliding-surface bearing reaches in the corresponding sliding guide of the holding part to absorb the forces that are transferred from the lever and operate vertically to the direction of insertion. The lever and the holding part are both fastened to the plug-in module so that they compensate the forces that are operating vertically to the direction of insertion.

The forces that are transferred from the lever affect the push-off shoulders and the push-off surface of the pressure piece as well as the gliding-surface bearing of the pressure piece. The effect of the force is distributed on a larger area, so that the contact pressure decreases and larger forces of the lever can be transferred. The cooperation of gliding guide and gliding-surface bearing prevents a deformation or bending of the pressure piece, the module bar respectively, since the vertical components of the lever force are compensated. The gliding guide that reaches into the gliding-surface bearing also reliably prevents that the lever disengages from the pressure piece.

In one embodiment, the holding part has a pivot bearing for the lever. The pivot bearing can be formed as pin or swivel bolt which is guided through a drill hole in the holding part and to which the lever is swivel-mounted. The direct gripping of the lever at the holding part further improves the force transfer so that even higher lever forces can be absorbed.

The gliding guide at the holding part can be shaped as a guiding bar, which runs parallel to the direction of insertion. The gliding-surface bearing at the pressure piece can be shaped as a groove that corresponds with the guiding bar. The guiding groove and the guiding bar automatically cause a centering of the plug-in module. The plug-in module is fixated vertically to the direction of insertion in the desired position, but is at the same time moveable in the direction of insertion. Therefore, guiding bar and guiding groove take over the centering function, which is usually performed by the industry known centering pin.

The guide bar can have an L-shaped cross-section, whereby the short L-leg runs parallel to the module bar of the module frame. The guide groove then has a corresponding rectangular cross-section so that a safe gripping of the guide bar into the guide groove is guaranteed and a slip out is reliably prevented. The centering effect is improved at the same time and a good transfer of the forces that appear vertically to the direction of insertion is possible at the same time. The L-shaped cross-section of the guide bar can technically be easily produced. It additionally offers the advantage, that the L-leg of the guide bar can be designed relatively strong to withstand even strong forces. Also, the side parts of the guide groove can be designed strong accordingly. The rectangular cross-section of the guide groove that fits with the L-shaped guide bar can easily be produced by sawing it out or milling.

The short lever arm of the lever can have two lever cams that are arranged distant from each other and two push-off noses that are arranged next to each other. For practical purposes the pressure part has a center piece which has one push-off shoulder and one recess on each side, whereby the guide groove is formed in the center part. In this case the pressure piece has a structure that is symmetric to the center part. The dual design of the lever cam and the push-off nose at the short lever arm of the lever corresponds with the two recesses and push-off shoulders of the pressure piece. The total contact area for the lever is therefore doubled. The contact pressure during the insertion and extraction of the plug-in module is therefore cut in half. With this distribution of force very high lever forces can be transferred to the pressure piece as well.

The two lever cams of the lever reach into the two recesses on both sides of the guide groove, so that the two lever cams as well take on a centering function in direction parallel to the module bar. At the same time, the centering function is complemented by the guide groove and the guide bar. This arrangement absorbs cross forces generated by the adjacent plug-in modules. The plug-in module also remains in its position with lateral forces.

BRIEF DESCRIPTION OF THE DRAWINGS

FIGS. 7a, 7b show the pressure piece of the device according to FIG. 2a in detail; and FIG. 8 shows a pressure piece with T-shaped base, in accordance with one embodiment.

DETAILED DESCRIPTION

In the following detailed description, reference is made to the accompanying drawings which form a part hereof, and in which are shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1:
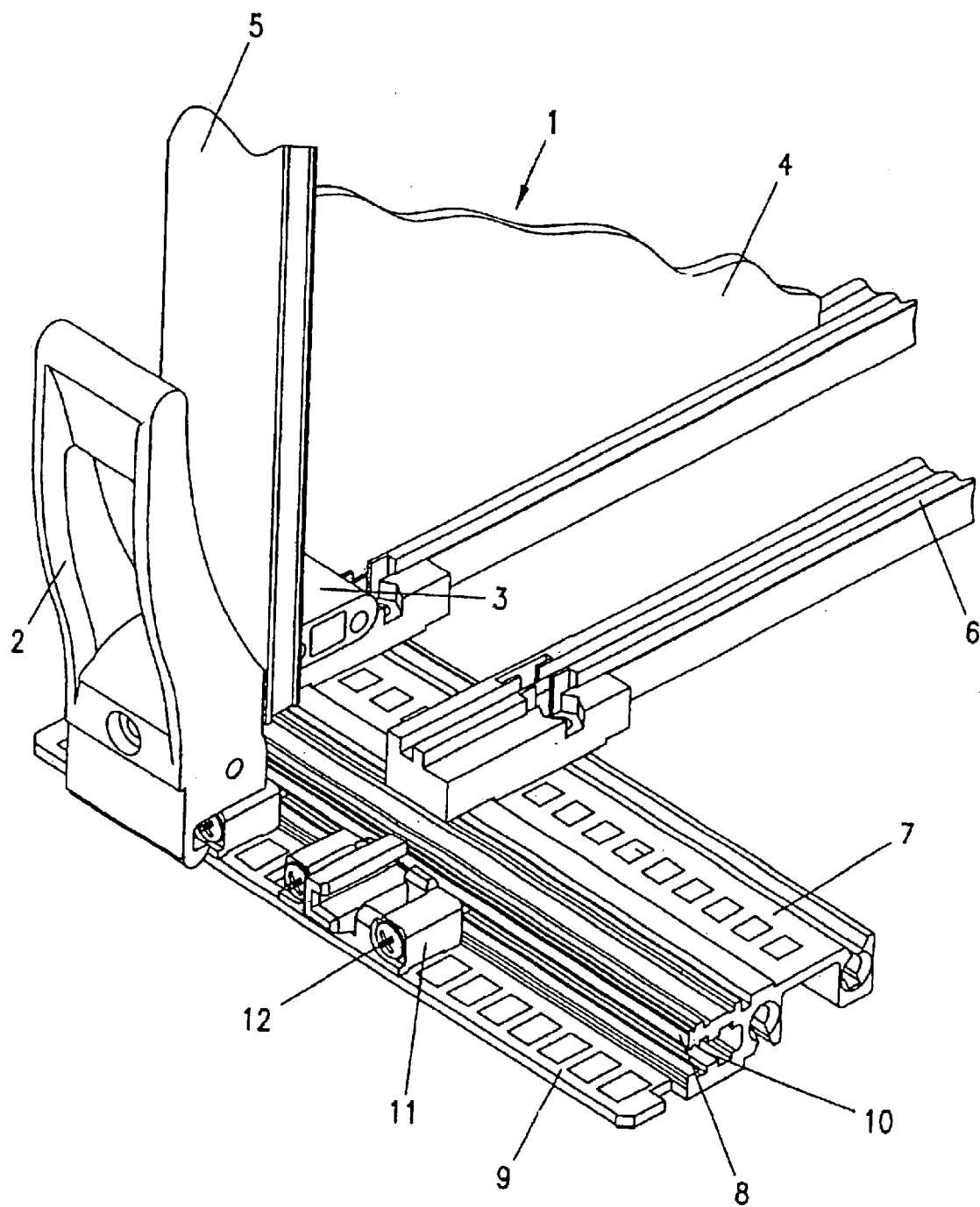
FIG. 1 shows the front part of a module frame with an inserted plug-in module, in perspective illustration, in accordance with one embodiment.

FIG. 1 illustrates a section of a plug-in module 1 which has a lever 2, a holding part 3, a circuit plate 4 (drawn in part), and a front plate or front panel 5 (drawn in part as well). The plug-in module 1 is inserted in a slide-in bar 6. The slide-in bar 6 is carried by a front, lower module bar 7, which is part of a module frame. An overhanging small strip, the so called roof 9, is attached on the front side 8 of the module bar 7. The roof 9 has equidistant arranged recesses. A T-groove 10 is located on the front side 8 of the module bar 7.

A pressure piece 11 is fastened on the front side 8 of the module bar 7. The pressure piece 11 is carried by the roof 9. Two fastening screws 12 reach into the T-groove 10 of the module bar 7 and establish the connection between the pressure piece 11 and the module bar 7.

Figure 2A:
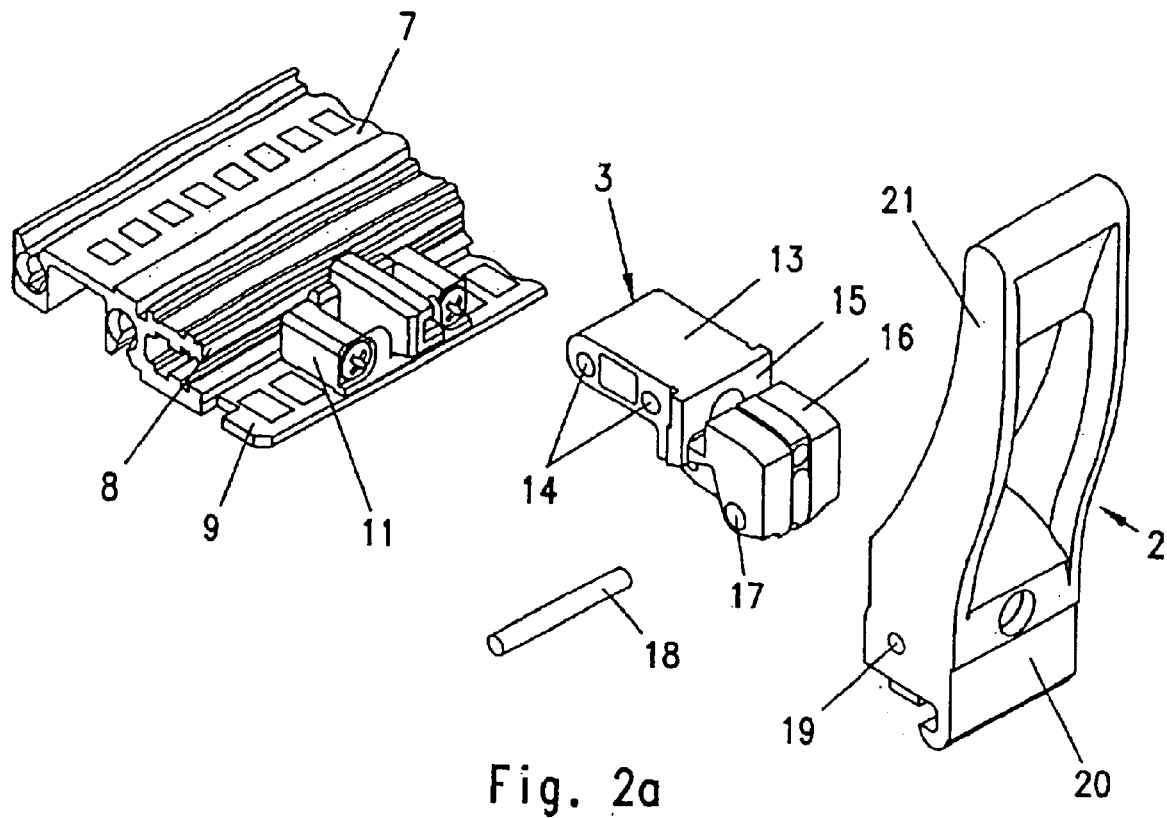
FIGS. 2a, 2b show the device for insertion and extraction of the plug-in module of FIG. 1, in an exploded view.

FIG. 2a illustrates the individual components of the device, viewed from above. The pressure piece 11 is screwed on to the module bar 7. The pressure piece 11 is positioned with its bottom side on the flat roof 9. It is furthermore positioned on the front side 8 of the module bar 7 and therefore extends the module bar 7 in the direction of insertion. The pressure piece 11 is flush with the roof 9.

The holding part 3 has a console 13 with two fastening drill holes 14. The circuit plate 4 (not shown) will be attached with screws to the console 13 of the holding part 3, whereby the screws reach into the fastening drill holes 14. A cross slot 15 serves for the reception of the front panel (not shown here). A bearing bracket 16 connects to the cross slot 15. A pivot bearing 17 is located in the bearing bracket 16 and formed as drill hole that runs transversal to the direction of insertion. The bearing bracket 16 receives a swiveling axis 18. The swiveling axis 18 reaches at the same time into the holding holes 19 of the lever 2.

The lever 2 has a short lever arm 20 and a long lever arm 21. The long lever arm 21 is fork-shaped, whereby the two side forks are connected with each other at the upper end by a cross bar.

Figure 2B:
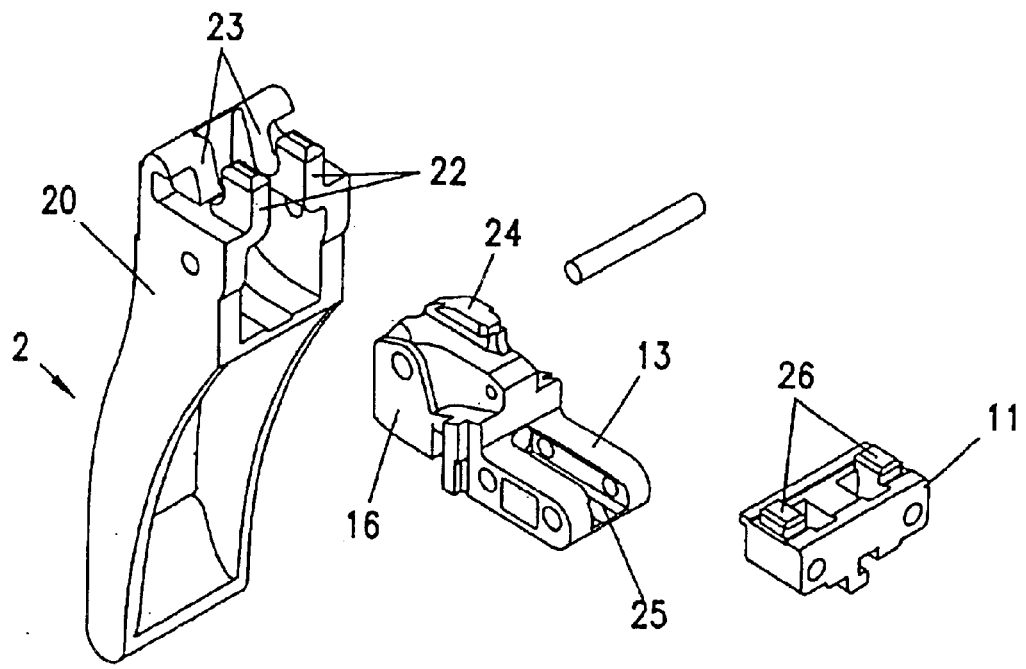

FIG. 2b illustrates the components of the device from the opposite perspective. The lever 2 has at its short lever arm 20 two lateral, distant to each other, parallel arranged lever cams 22. Parallel to the lever cams 22 are two push-off noses 23.

The holding part 3 has at the bottom side of the bearing bracket 16 a guide bar 24, which runs in the direction of the console 13. A corresponding longitudinal groove 25 is formed in the console 13.

The pressure piece 11 is shown in FIG. 2b from its bottom side. Two locking blocks 26, which are arranged with a distance between them and next to each other, are attached to the bottom side of the pressure piece 11, close to the outer sides. The contact surface of the pressure piece 11, by which it is positioned at the module bar 7, is also formed as a flat surface.

Figure 3:
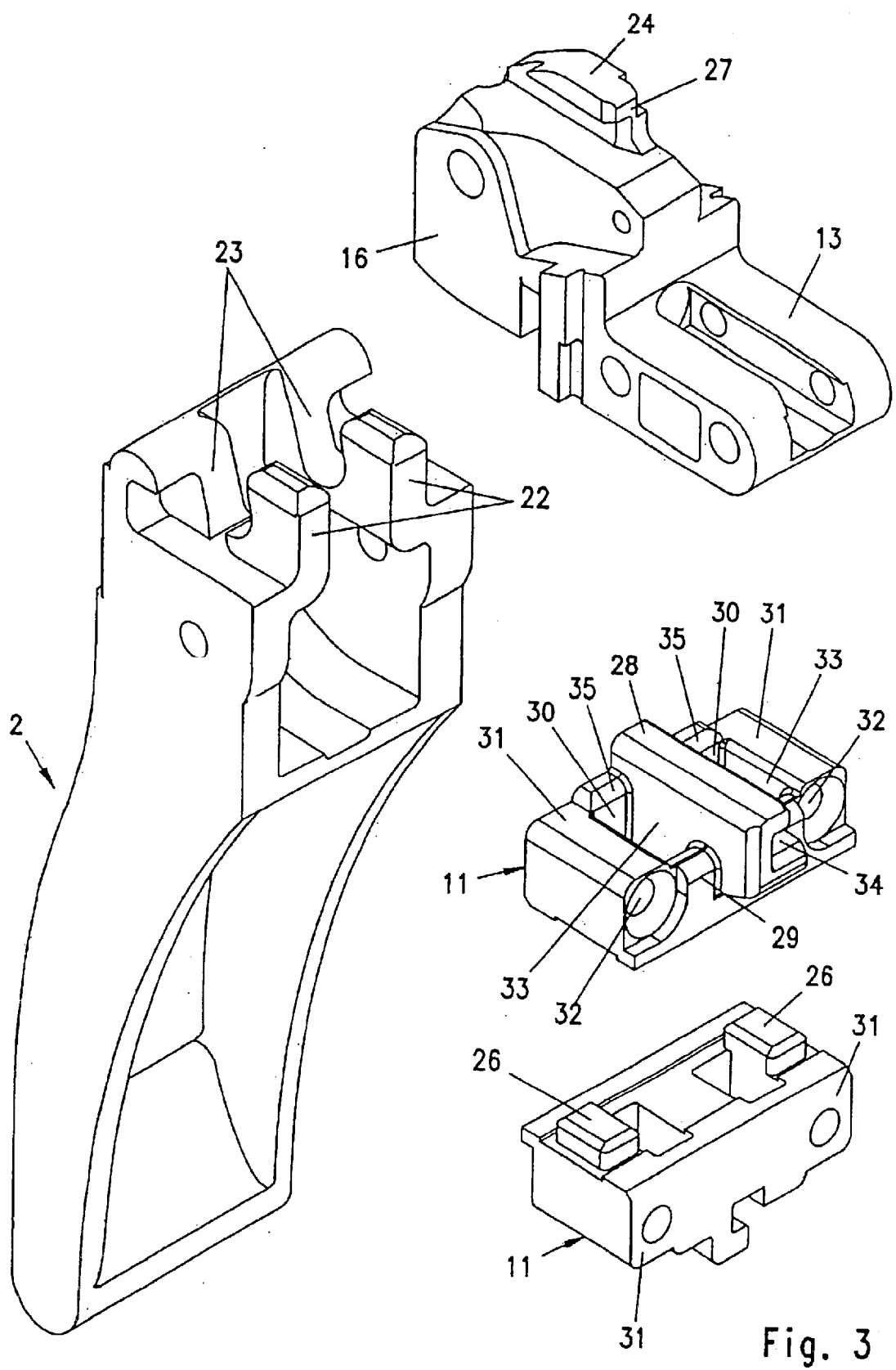
FIG. 3 shows the individual parts of the device of FIG. 2a, in an enlarged scale.

A detailed illustration of the individual parts of the device shows FIG. 3.

The guide bar 24, located on the bearing bracket 16, is formed L-shaped in cross-section and extends in the direction of insertion. The short L-leg 27 of the guide bar 24 is oriented transversal to the direction of insertion. The end of the guide bar 24 that is positioned away from the console 13 narrows to a wedge. A counter bearing that is inserted from the small side of the wedge can therefore easily glide, at the beginning with clearance, over the guide bar 24 to engage it.

The two lever cams 22 of the lever 2 are formed parallelepiped, whereby the ends narrow towards the top, so that a frustum is formed. The push-off noses 23 are distant from the two lever cams 22. They are positioned parallel to each other and align with the lever cams 22.

The pressure piece 11 is essentially symmetrically built. A center part 28 that runs in direction of insertion forms the symmetry axis. One push-off shoulder 29 and one push-off surface 30 are arranged on both sides of the center part 28. The push-off shoulders 29 and the push-off surfaces 30 connect the center part 28 with outer parts 31 that run parallel to the center part 28. A drill hole 32, which extends in the direction of insertion and serves for the reception of a fastening screw 12, is located in each of the outer parts 31. The center part 28 and the outer parts 31 define, together with the push-off shoulder 29 and the push-off surface 30, a recess 33 which has a rectangular cross-section. Because of the symmetrical structure of the pressure piece 11, two recesses 33 exist on both sides of the center part 28 in which the lever cams 22 of the lever 2 reach into.

The center part 28 has a gliding-surface bearing which is formed a guide groove 34. The guide groove 34 extends along the center part in the direction of insertion, whereby the opening of the guide groove 34 points in direction of one of the outer parts 31 and therefore transversal to the direction of insertion. The guide groove 34 serves for the reception of the guide bar 24 of the holding part 3.

The push-off shoulders 29, which connect the outer parts 31 with the center part 28, are rounded in the upper area, so that sharp edges on the top parts are avoided. The push-off surface 30 is part of a connecting bar 35 which is positioned between the center part 28 and the outer part 31. The connecting bar 35 is beveled at its top. It is higher than the outer part 31, but lower than the center part 28.

Positioned on the bottom part of the pressure piece 11, locking blocks 26 are arranged in the area of the outer parts 31. They are slightly beveled to avoid sharp edges on the top part of the locking blocks 26.

The FIGS. 4a through 4d show the function of the devices according to invention during the extraction of the plug-in module 1 from the module frame.

Figure 4A:
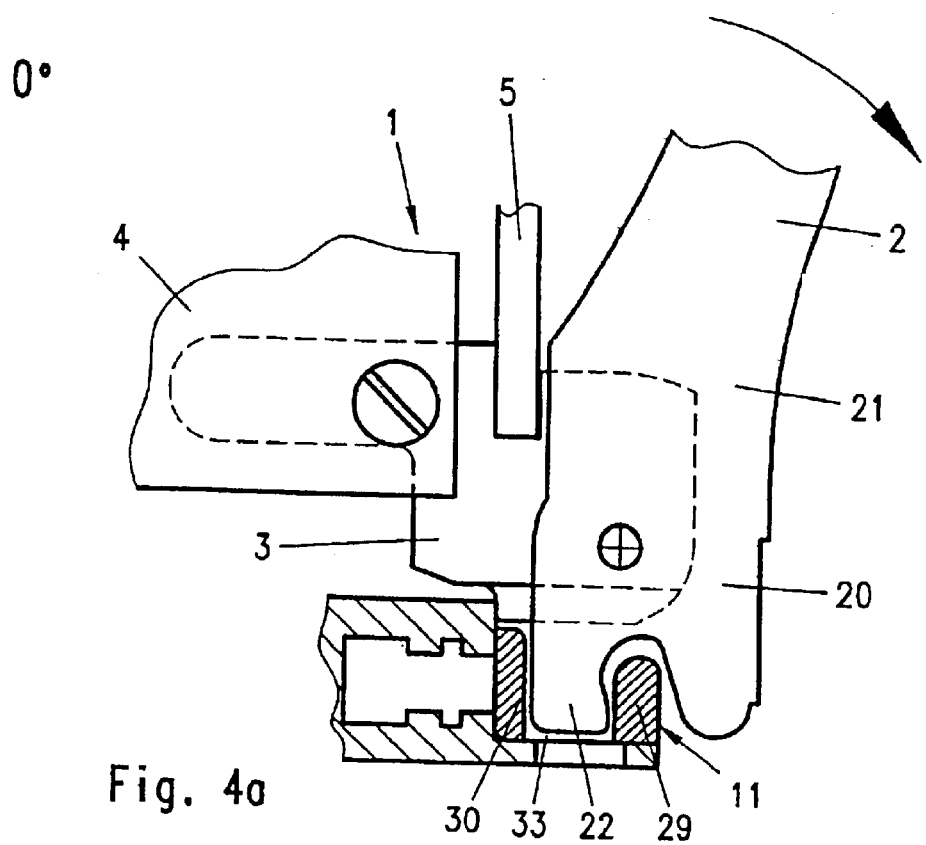
FIGS. 4a through 4d show the device according to FIG. 2a during the extraction of the plug-in module, in sectional views.
Figure 4B:
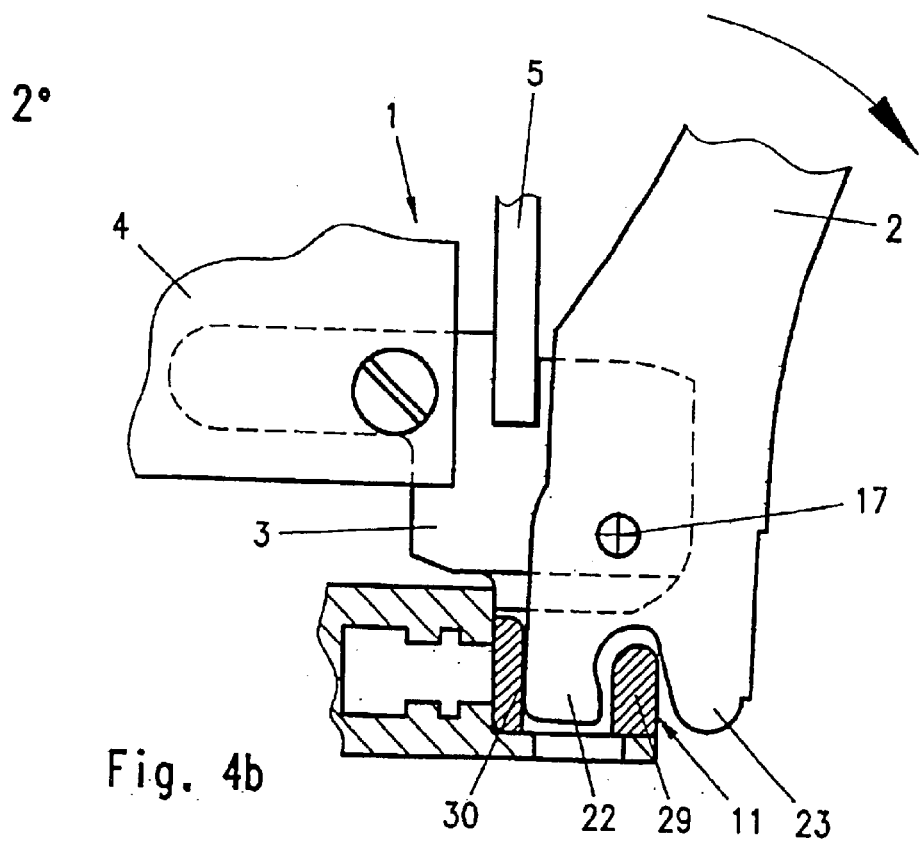

FIG. 4a shows the plug-in module 1 completely inserted in the module frame. The circuit plate 4 is fastened to the holding part 3 with a screw. The front panel 5 is positioned between the circuit plate 4 and the lever 2. The lever 2 is in the vertical starting position (0°), whereby the short lever arm 20 points vertically downwards. In this position the lever cam 22 reaches into the recess 33 of the pressure piece 11, but is not in contact with the push-off shoulder 29 or the push-off surface 30 of the pressure piece 11.

With the beginning of the extraction of the plug-in module 1 from the module frame (FIG. 4b), the long lever arm 21 of the lever 2 is turned clockwise around the bearing bracket 17. The outer surface of the lever cam 22 now presses against the push-off surface 30. The push-off nose 23 of the lever 2 does not yet touch the push-off shoulder 29 of the pressure piece 11.

Figure 4C:
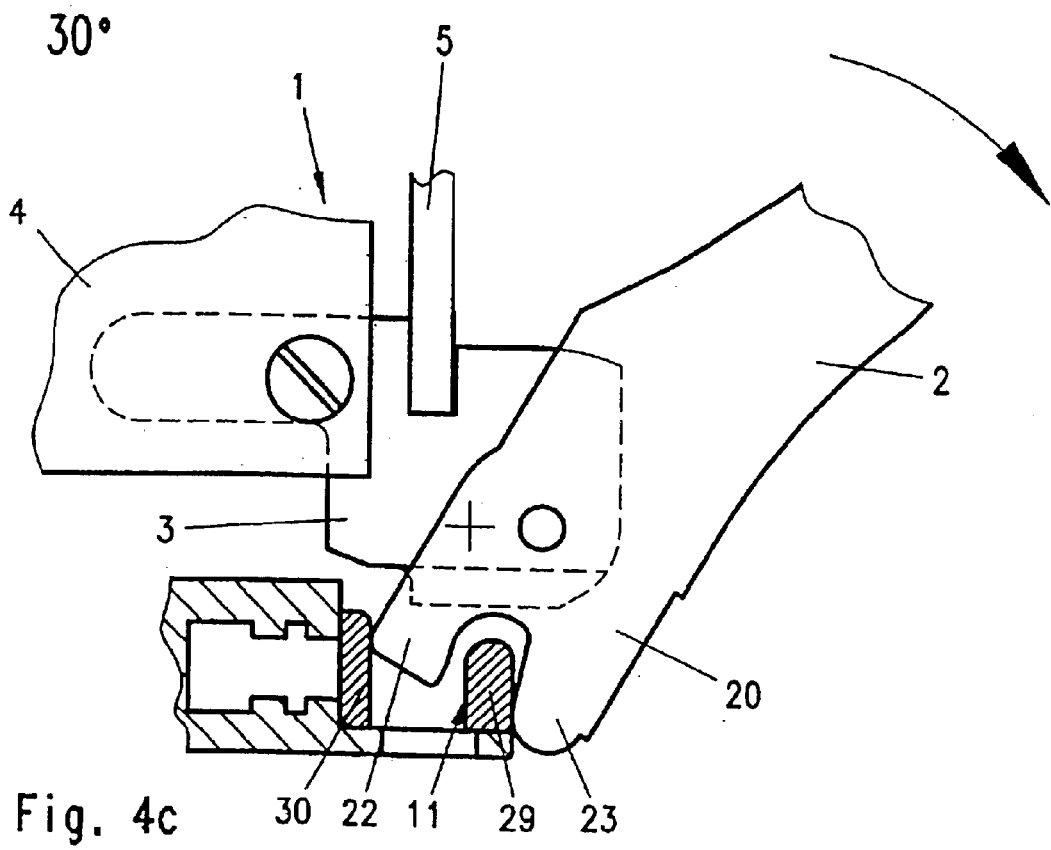

With the progressive rotational movement of the lever 2, as shown in FIG. 4c, the pressure point moves between the lever cam 22 and the push-off surface 30 from the lower area of the push-off surface 30 upwards. Before the lever cam 22 is disengaged from the push-off surface 30 the push-off nose 23 of the short lever arm 20 is positioned on the push-off shoulder 29. The force transfer between the lever 2 and the pressure piece 11 is now generated by the lever cam 22 as well as the push-off nose 23.

Figure 4D:
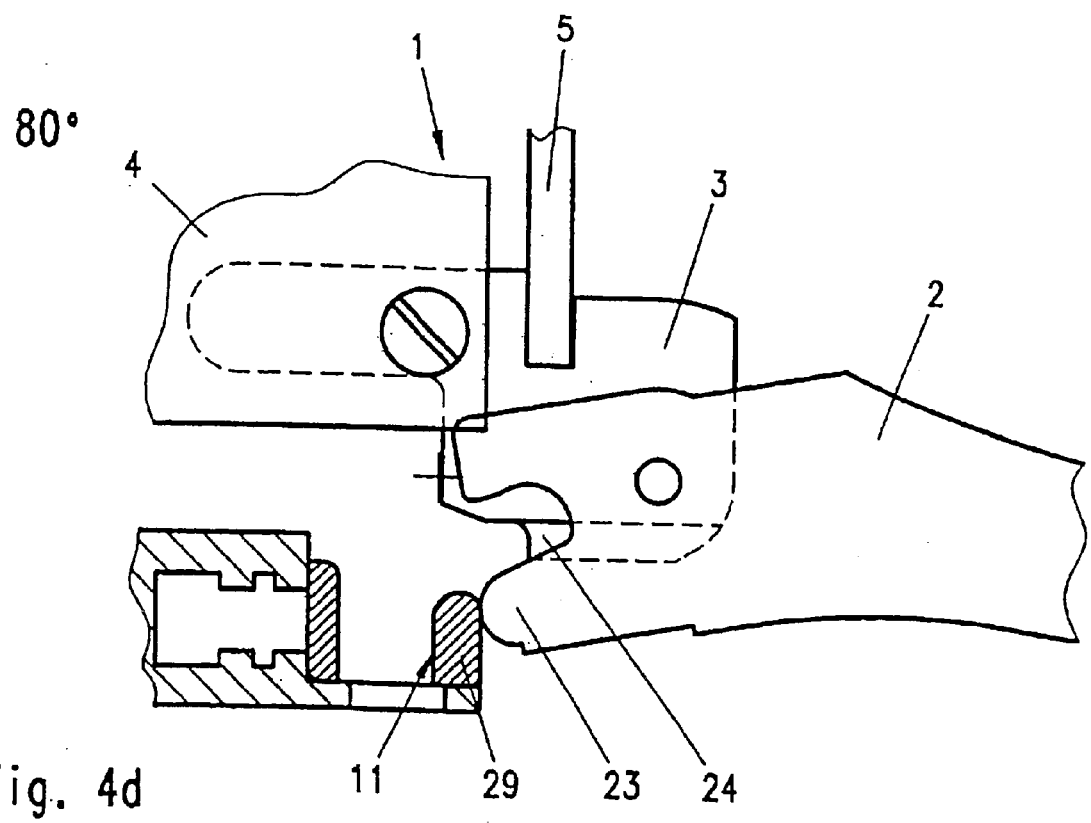

In the further course of the extraction of the plug-in module 1 from the module frame the lever 2 is further rotated until it reaches a position that is inclined by approximately 80° (FIG. 4d). During the push-off from the push-off shoulder 29 the push-off nose 23 moved upwards and is now positioned in the upper area of the outside of the push-off shoulder 29. The plug-in module 1 is now so far extracted from the module frame that the (not shown) multipolar plug connectors are pulled out of the contact strips. In this position of the lever 2, in which the plug connection is disengaged, the guide bar 24 leaves the (not shown) guide groove 34 of the pressure piece 11.

The reversed movement of insertion of the plug-in module 1 in the module frame is illustrated in the FIGS. 5a through 5d.

Figure 5A:
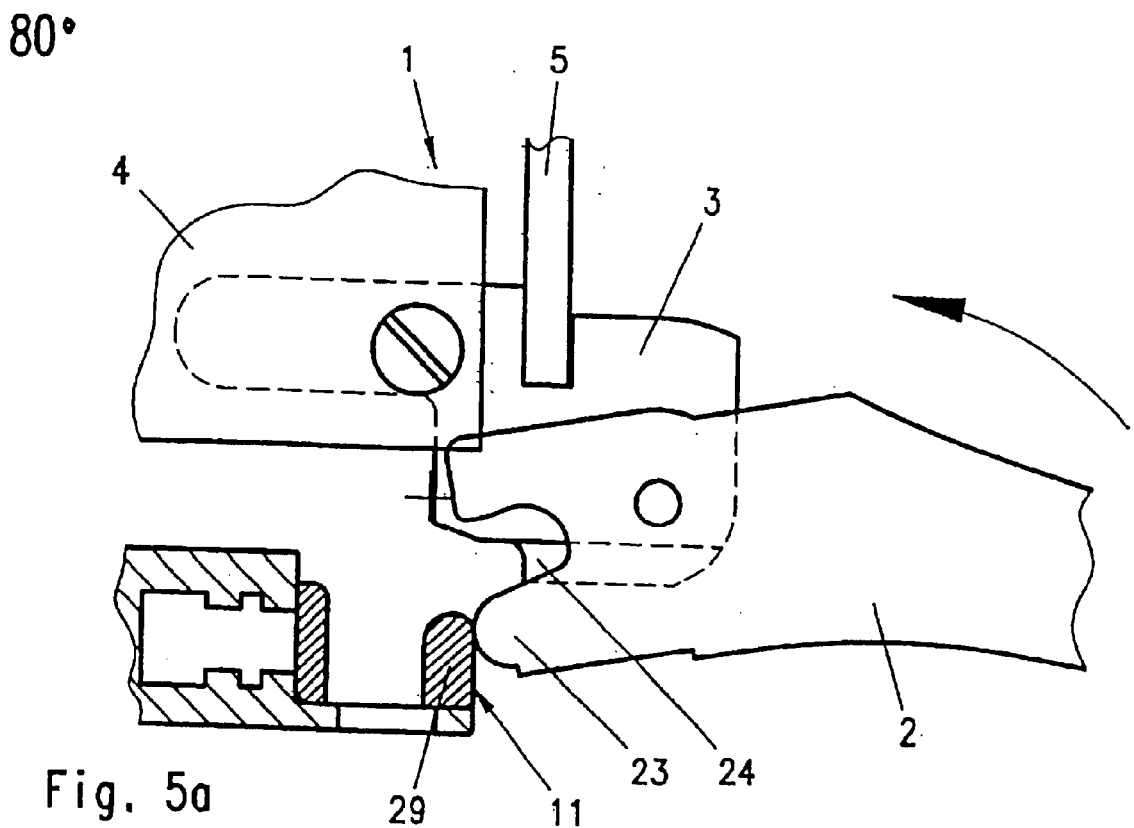
FIGS. 5a through 5d show the device according to FIG. 2a during the insertion of the plug-in module, in sectional views.

It is proceeded from the lever position of about 80°, in which the lever 2 is almost horizontal (FIG. 5a). First, the plug-in module 1 is pushed into the slide-in bar 6 of the module frame until the guide bar 24 of the holding part 3 is engaged with the guide groove 34 (compare FIG. 3) of the pressure piece 11 and the push-off nose 23 touches the push-off shoulder 29 of the pressure piece 11. The plug connectors at the end of the circuit plate 4 are not touching the contact strips of the back plane yet. The engagement of the guide bar 24 and the guide groove 34 precedes the bonding of the plug connectors.

Figure 5B:
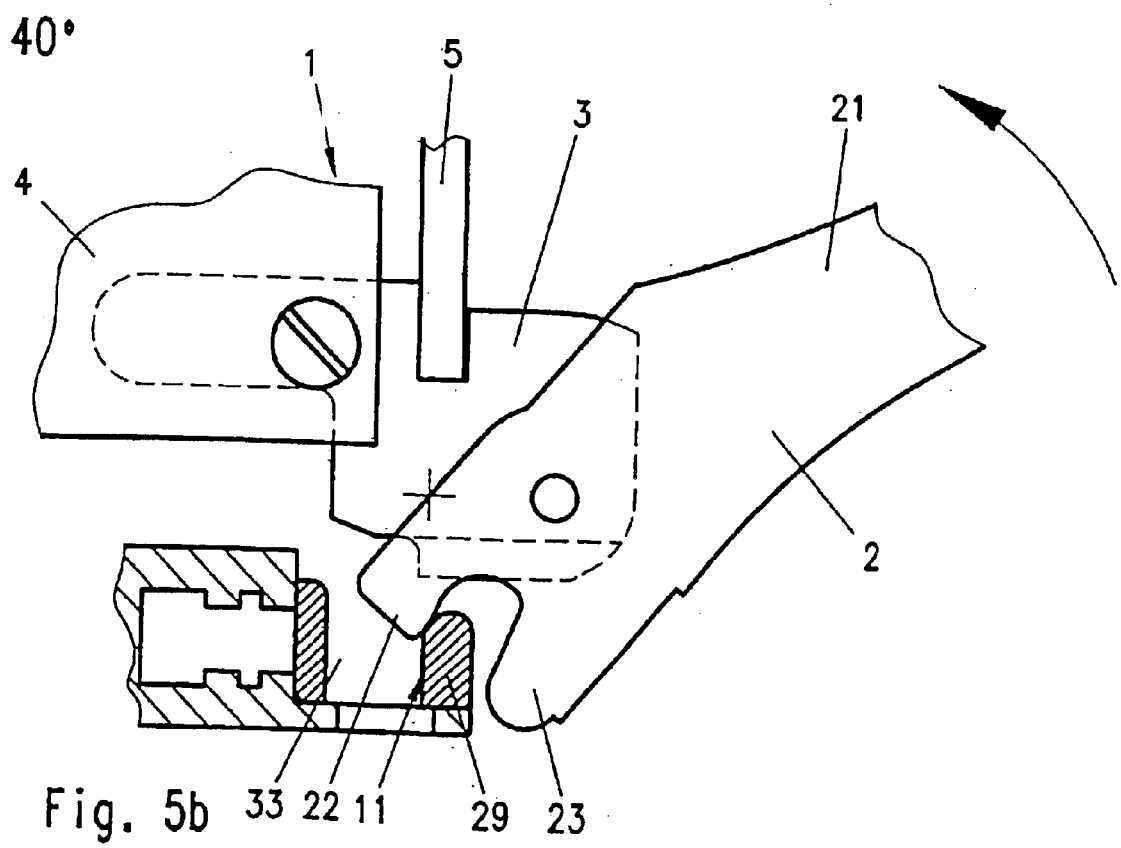

The further turning of the long lever arm 21 of the lever 2 counterclockwise has the result, that the push-off nose 23 is no longer in contact with the push-off shoulder 29 (FIG. 5b). But now the lever cam 22 begins to engage in the recess 33 of the pressure piece 11. The lever cam 22 pushes in the upper area against the push-off shoulder 29. The force that is transferred from the lever 2 operates inclined from the top against the push-off shoulder 29. The vertical component of the force is compensated by the interlocking of the guide bar 24 of the holding part 3 with the guide groove 34 of the pressure piece 11. The horizontal component of the force causes a horizontal movement of the plug-in module 1 into the module frame.

Figure 5C:
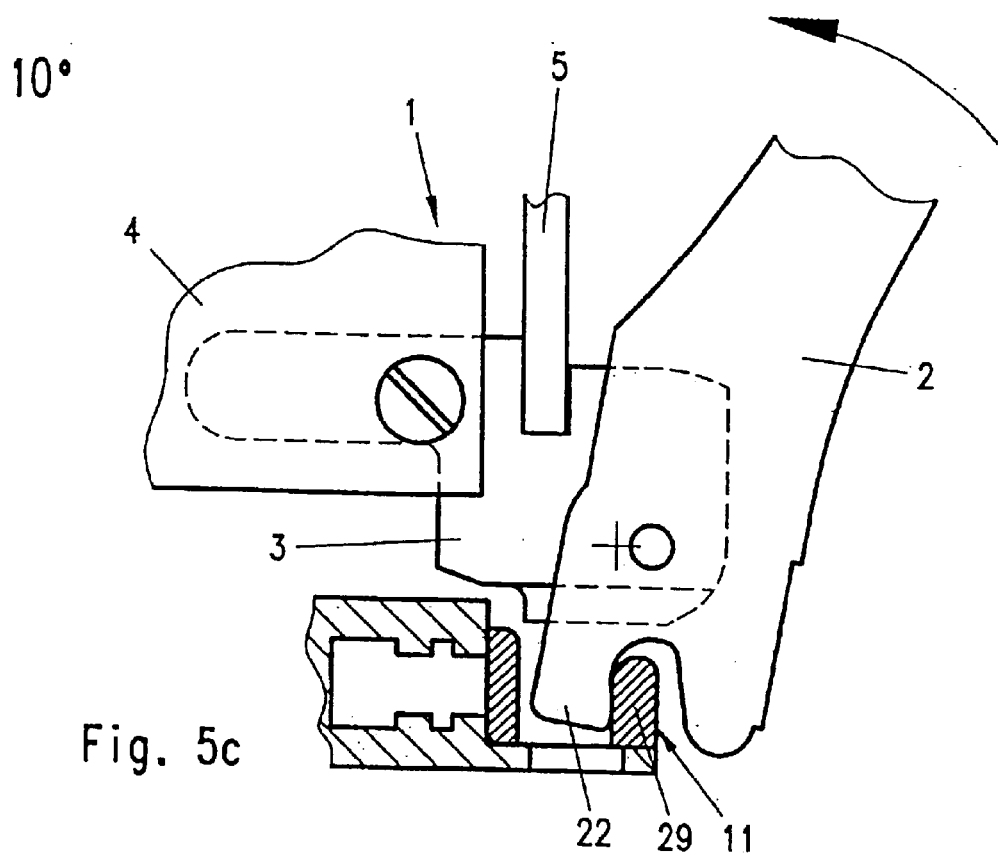

With the progressive rotational movement of the lever 2 counterclockwise, the lever cam 22 glides downwards along the push-off shoulder 29. The lever cam 22 continues to push against the push-off shoulder 29 and therefore transfers the lever forces of the lever 2 to the pressure piece 11, which leads to a further insertion of the plug-in module 1 into the module frame (FIG. 5c).

Figure 5D:
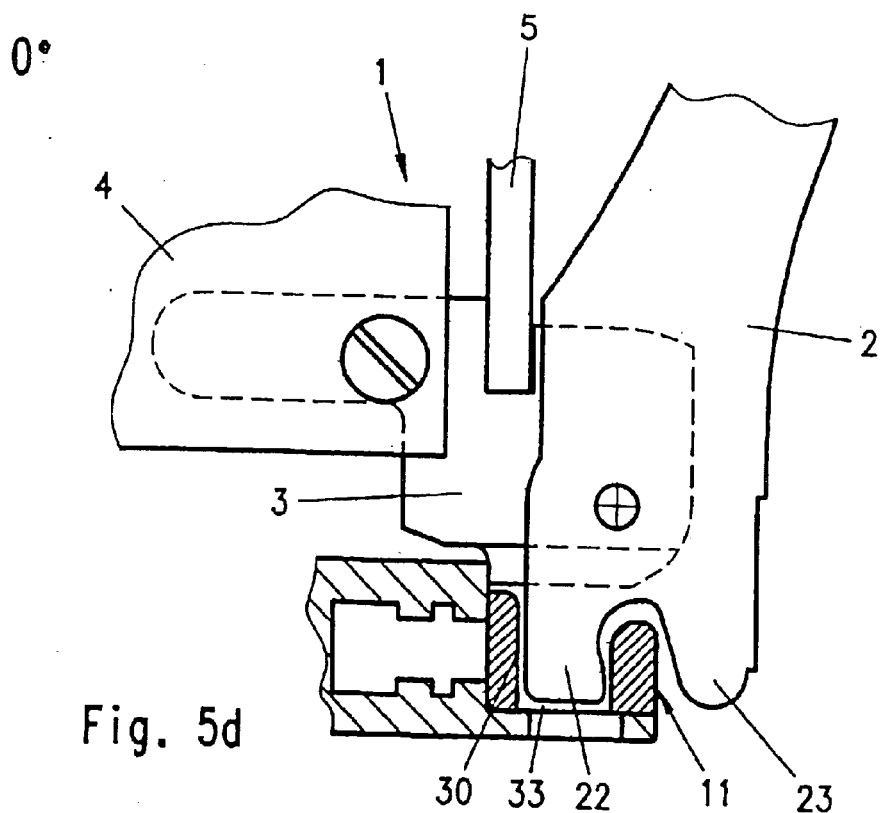

The insertion of the plug-in module 1 into the module frame is completed when the lever 2 reaches its final position (0°). The lever cam 22 is now completely engaged in the recess 33 but it does not touch the push-off shoulder 29 or the push-off surface 30 (FIG. 5d).

If the lever 2 with the lever cam 22 and the push-off nose 23 and the pressure piece 11 with the push-off shoulder 29 and the push-off surface 30 are made of metal, for example produced by die-casting, metal abrasion could occur. Excessive abrasion is avoided by the fact that the lever cam 22 as well as the push-off nose 23 is designed accordingly in size. But metal abrasion can be prevented completely if either the complete lever 2 is made of plastic, or at least the lever cam 22 and the push-off nose 23 are coated with a material with low friction coefficients. Examples of materials for such a coating are plastic or Teflon.

Figure 6:
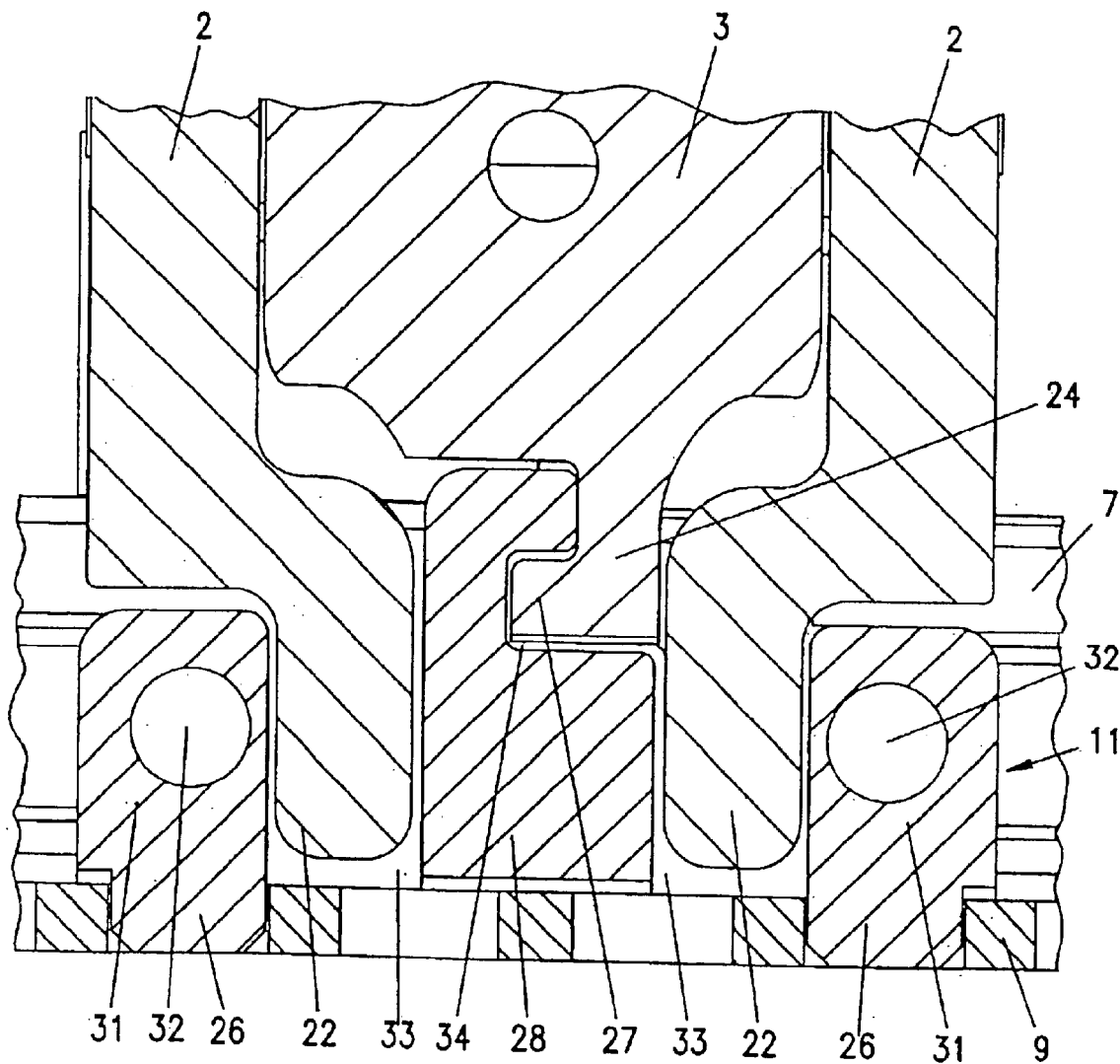
FIG. 6 shows the device according to FIG. 2a, in a vertical cut and enlarged scale.

FIG. 6 illustrates a cross-section through the device according to invention. The cut is performed parallel to the module bar 7 through its roof 9. Accordingly, only the recesses in roof 9 of the module bar 7 and the bars in between are illustrated.

FIG. 6 shows the two outer parts 31 of the pressure piece 11 with the drill holes 32 that run in the direction of insertion. The locking blocks 26, which are located at the bottom part of the pressure piece 11, reach into the recesses of the roof 9 of the module bar 7. Located between the two outer parts 31 is the center part 28 with the laterally open guide groove 34. From the top the two lever cams 22 of the lever 2 reach in the recesses 33 between the outer parts 31 and the center part 28. The lever 2 is swivel-mounted at the holding part 3. At the holding part 3 is the L-shaped guide bar 24, whereby the short L-leg 27 runs parallel to the module bar 7 and reaches into the guide groove 34 which is open to the side.

At the beginning of the pull-in of the plug-in module 1 into the module frame the lever cams 22 push from the top at an angle of approximately 40° on the push-off shoulders 29 (not shown) against the pressure piece 11. Thereby, a vertical force is applied from the lever cam 22 on the pressure piece 11. The lever cams 22 and the lever 2 support themselves upwards on the pressure piece 11. Along with the lever 2, the holding part 3 also supports itself upwards and is connected with the lever 2 by the swiveling axis 18 (compare FIG. 2a). The guide bar 24 of the holding part 3, which is engaged with the guide groove 34 of the pressure piece 11 pulls upwards as well. The occurring forces are mostly compensated in a vertical direction because of the cooperation of the guide bar 24 with the guide groove 34 of the pressure piece 11 and the friction-locked connection between the holding part 3 and the lever 2, which pushes off the pressure piece 11.

FIG. 6 also allows the recognition of the centering effect of the device. Lateral cross forces that impact the plug-in module 1 which are generated from the adjacent plug-in modules are absorbed by the device. The guide bar 24 which reaches into the guide groove 34 fixates the plug-in module 1 against cross forces, which operate in the direction of the short L-leg 27 of the guide bar 24. Forces that occur in the opposite direction are absorbed by the lever cam 22 in cooperation with the guide bar 24. A centering of the plug-in module 1 is also achieved by the fact that the lever cams 22 reach into the recesses 33 so that the center part 28, the outer parts 31 respectively, hold them in position. The locking blocks 26, which reach into the recess of the roof 9 of the module bar 7, are also part of the positioning of the plug-in module 1.

FIG. 7a illustrates the pressure piece 11 and a tapped-hole strip 36 with tapped holes 37. The tapped holes 37 in the tapped-hole strip 36 are formed in such a way that they correspond with the drill holes 32 of the pressure piece 11. The tapped-hole strip 36 will be inserted into the T-groove 10 of the module bar 7. The fastening screws 12 then reach into the tapped holes 37 of the tapped-hole strip 36 and therefore fasten the pressure piece 11 to the front panel 8 of the module bar 7.

The position of the pressure piece 11 is determined by the tapped holes 37 of the tapped-hole strip 36 so that the pressure piece 11 is centered in front of a slot for the plug-in module 1.

FIG. 7b shows the pressure piece 11, cut along the Line I—I from FIG. 7a. The push-off shoulder 29 is rounded in the upper area so that the engagement of the lever cam 22 along the push-off shoulder 29 during the insertion and extraction of the plug-in module 1 in or out of the module frame is made easier. The push-off surface 30 is the inside of the connecting bar 35; it is also formed as a large and smooth surface like the in- and outside of the push-off shoulder 29. The recess 33 is located between the connecting bar 35, the push-off surface 30 and the push-off shoulder 29.

FIG. 8 shows a specific design of the pressure piece 11. A T-shaped base 38 is attached on the contact surface of the pressure piece 11 to the front side 8 of the module bar 7. The T-shaped base 38 corresponds with the T-groove 10 of the module bar 7 and can be inserted lateral into the T-groove 10. The drill holes 32 of the pressure piece 11 reach through the T-shaped base 38. The fastening screws 12 reach through the drill holes 32, so that a screw connection can be created between the T-groove 10 and the pressure piece 11.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A device for the insertion and extraction of a plug-in module into a module frame having a module bar, the device comprising:
   a swivel-mounted lever located in a front area of the plug-in module, the swivel-mounted lever having a short lever arm having at least one lever cam and a push-off nose; and
   a pressure piece that is mounted to the module bar to absorb any forces transferred from the lever, wherein the pressure piece has at least one recess in which the at least one lever cam of the lever reaches during insertion of the plug-in module, and at least one push-off shoulder against which the push-off nose of the lever pushes off during the extraction of the plug-in module.

2. The device of claim 1, wherein the pressure piece has a push-off surface against which the lever cam pushes during the extraction of the plug-in module.

3. The device of claim 1, wherein the push-off shoulder is aligned parallel to the front side of the module bar.

4. The device of claim 1, wherein the pressure piece is removable and fastened on a front side of the module bar.

5. The device of claim 1, wherein the pressure piece has at least one drill hole for the reception of a fastening screw.

6. The device of claim 1, wherein the pressure piece in cross-section has a T-shaped base for the insertion in a T-groove of the module bar.

7. The device of claim 1, further comprising a holding part fastened to the plug-in module, the holding part having a glide guide, and wherein the pressure piece has a gliding-surface bearing that engages with the holding part to absorb any forces that are transferred from the lever and occur vertical to a direction of insertion.

8. The device of claim 7, wherein the holding part includes a pivot bearing for the lever.

9. The device of claim 7, wherein the glide guide on the holding part is formed as a guide bar which extends parallel to the direction of insertion, and wherein the gliding-surface bearing at the pressure piece is formed as guide groove.

10. The device of claim 9, wherein the guide bar includes an L-shaped cross-section having a short L-leg running parallel to the module bar of the module frame, and wherein the guide groove has a rectangular cross-section.

11. The device of claim 1, wherein the short lever arm of the lever has two lever cams that are arranged distant from each other, and two push-off noses that are arranged next to each other, wherein the pressure piece has a center part which has one push-off shoulder and one recess on both sides, and wherein the guide groove is formed in the center part.

* * * * *